United States Patent [19]

Sohda et al.

[11] Patent Number: 5,387,799
[45] Date of Patent: Feb. 7, 1995

[54] ELECTRON BEAM WRITING SYSTEM

[75] Inventors: Yasunari Sohda, Hachioji; Hideo Todokoro, Tokyo; Hiroyuki Itoh, Katsuta; Shinichi Kato, Mito, all of Japan

[73] Assignee: Hitachi, Ltd., Tokyo, Japan

[21] Appl. No.: 885,608

[22] Filed: May 19, 1992

[30] Foreign Application Priority Data

May 20, 1991 [JP] Japan ................................. 3-114468

[51] Int. Cl.⁶ .............................................. G21K 1/093
[52] U.S. Cl. .............................. 250/492.2; 250/396 R; 250/396 ML
[58] Field of Search ............... 250/492.2 R, 492.3, 250/398, 396 R, 396 ML, 397

[56] References Cited

U.S. PATENT DOCUMENTS

| | | | |
|---|---|---|---|
| 4,075,485 | 2/1978 | Lijewski et al. | 250/369 |
| 4,701,620 | 10/1987 | Okumura et al. | 250/398 |
| 5,099,133 | 3/1992 | Yamada | 250/492.2 |
| 5,136,167 | 8/1992 | Langner et al. | 250/396 R |
| 5,168,166 | 12/1992 | Hayakawa et al. | 250/492.2 |
| 5,283,440 | 2/1994 | Sohda et al. | 250/492.22 |

OTHER PUBLICATIONS

Proceedings of Autumn Meeting of Japan Society of Precision Engineering, (1987), pp. 565–566.
J. Vac. Sci. Technology, B9(6), Nov./Dec. 1991, pp. 2940–2943.

*Primary Examiner*—Jack I. Berman
*Assistant Examiner*—James Beyer
*Attorney, Agent, or Firm*—Fay, Sharpe, Beall, Fagan, Minnich & McKee

[57] ABSTRACT

An electron beam writing system which permits a relatively low voltage to be applied to perform high speed focus correction with high accuracy. The electron beam writing system includes a focus corrector arranged inside a lens which provides the largest product of the magnification factors of the lens and all succeeding lenses and the optical path length of the lens at issue. Thus, the electron beam provides high sensitivity and a small change in the magnification ratio due to the correction.

7 Claims, 5 Drawing Sheets

DISTANCE FROM OBJECT PLANE (mm)

ELECTRON BEAM WRITING SYSTEM

BACKGROUND OF THE INVENTION

The present invention relates to an electron beam writing or lithography system, and more particularly to an electron beam writing system using a cell projection method.

In a prior art variable shaped-beam writing system, as disclosed by Morita et al in "Proceedings of the Autumn Meeting of the Japan Society of Precision Engineering in Fiscal Showa 61 (1987)" pages 565–566, an electrostatic focus corrector is provided in a demagnification lens. Specifically, the entire beam optical path length is shortened to by half for the purpose of reducing the Coulomb effect, and a tip-planar type $LaB_6$ is used as an electron gun, thereby providing sufficient brightness and emittance. The lens system is composed of a projection lens, a shaping lens, a demagnification lens and an objective lens. In order to realize high speed beam deflection scanning, all deflectors and correction lenses are of an electrostatic type. This is because the electrostatic-type instruments do not generate delays in beam positioning due to an eddy current, which is problematic for magnetic-type instruments. Both shaping deflection and sub-deflection are performed by two four-pole electrostatic deflectors. Main deflection is performed by an eight-pole deflector. Focus correction is performed by a cylindrical electrostatic lens (i.e., an electrostatic focus corrector) arranged in a demagnification lens.

The variable shaped-beam writing device forms the image of a first square aperture on a second square aperture to create any square beam (an electron beam with a sectional shape vertical to the axis of the beam being square). In such a beam writing system, a deflector focuses the square beam at several positions on a wafer. Then, focus correction is made to correct field curvature. The focus correction changes the magnification ratio so that the size of the square beam on a wafer will also change. This gives rise to an undesired result of deteriorating the accuracy of shot stitching on the wafer. Namely, the beam projection areas fluctuate on the writing object such as a wafer.

Moreover, high-speed focus correction is required to enhance the throughput. Thus, the voltage to be applied to a focus corrector is desired to be as small as possible. However the prior art does not take the above problems into consideration.

SUMMARY OF THE INVENTION

The present invention intends to solve at least one of the problems described above.

To this end, the present invention proposes an electron beam writing system for making fine patterns on a wafer or a mask, in which an electrostatic corrector for correcting field curvature due to electron beam deflection and the height of a sample is arranged in a lens providing the largest product of the magnification factors of the lens and all succeeding lenses and the optical path length of the lens at issue, and in an objective lens in most cases.

FIG. 1 shows the trajectory 4 of an electron beam when one point on an object plane 1 is focused at one point on an image plane 3. The focal length f is expressed by $$1/f = 1/L_1 + 1/L_2 \tag{1}$$

Now it is assumed that only the focal length of the lens 2 is changed without shifting the center of the lens 2 (this can be realized by applying a voltage to an electrode 6 arranged in a magnetic field of an electromagnetic lens 5 as shown in FIG. 2, thereby adjusting electron energy). Then, the changing rate $\Delta f/f$ of the focal length for the correction length $\Delta z$ of an image plane position is expressed by $$\Delta f/f = \Delta z \times f/L_2^2 \tag{2}$$

Since the changing rate of electron energy $\Delta V/V$ is approximately equal to the changing rate $\Delta f/f$, Equation (2) yields $$\Delta V/V = \Delta z \times f/L_2^2 = \Delta z \times L_1/L_2(L_1+L_2) \tag{3}$$

Further, the correction length of the focus for the final image plane is $\Delta z$ multiplied by the succeeding lens magnification factors. Therefore the lens on which a focus corrector is to be arranged should be one providing the largest product of the magnification factors of the lens and all succeeding lenses, and the optical path length of the lens at issue, thereby realizing the high sensitivity. Thus, the voltage to be applied to the focus corrector can be decreased.

Generally, in a demagnification lens, the focal length $f_d \sim L_2$, and $L_2 < L_1$, whereas in an objective lens, $L_1 \sim L_2 \sim 2f_0$. Therefore, $$\Delta V/V = \Delta z/f_d \text{ (demagnification)} \tag{4}$$
$$= \Delta z/4f_o \text{ (objective)} \tag{5}$$

Further, it should be noted that the objective lens in an electron beam has a longer focal length than the demagnification lens has. For example, the focal length of the demagnification lens is 10 mm or so whereas that of the objective lens is 50 mm or so. For this reason, the focus corrector arranged in the objective lens can operate at a lower voltage by one order of magnitude or more than that in the demagnification lens.

The changing rate $\Delta M/M$ of the magnification factor due to the above focus correction can be approximated to $\Delta z/L_2$. Thus, the demagnification lens and the objective lens have changing rates in their magnification factors of $\Delta z/f_d$ and $\Delta z/2f_o$, as seen from Equations (4) and (5). Thus, the change in the magnification factor is smaller in the objective lens than in the demagnification lens. However, assuming that the correction length $\Delta z$ of an image plane position is 0.5 mm and the focal length is 50 mm, the objective lens provides a change of 0.5% in a beam projection area on an image plane. For example, where a pattern of 5 $\mu$m square is to be written, the corner of the pattern deviates toward a diagonal line by 0.035 $\mu$m.

This can be avoided by shifting the lens center in correcting the focus. If the lens center is shifted by $\Delta L$ as shown in FIG. 3, the change $\Delta M$ in the magnification ratio can be expressed by $$\Delta M/M = \Delta L/f - \Delta z/L \tag{6}$$

This permits the magnification ratio to be adjusted.

A change in the size of a figure, i.e., the area of the beam projected on an image plane, leads to a deterioration in the shot connection accuracy. Beam writing with high accuracy of 0.2 $\mu$m in line width can be attained with a change of 0.02 μm or less in the size of the largest shot figure. The largest pattern of 5 μm×1 μm requires a change of 0.4% or less in the beam projection area. Further, writing a quantum effect device of 0.1 μm or less requires higher accuracy. It should be noted that any change in the magnification ratio can be by removed by the following adjustment in Equation (6)

$$\Delta L = \Delta z/(M+1) \tag{7}$$

The lens center can be shifted by changing the electron energy only at a part of a lens magnetic field. For example, if an electrode 106, which may be an electrostatic corrector, inserted in an objective lens 5 is arranged at a position nearer to an object plane, as shown in FIG. 4, to decelerate electron beams on the side near to the object plane with respect to the objective lens, the lens center can be shifted toward the object plane. This permits the magnification ratio to be decreased.

BRIEF DESCRIPTION OF THE DRAWINGS

These and other objects and technical advantages of the present invention will be readily apparent from the following description of the preferred exemplary embodiments of the invention in conjunction with the accompanying drawings, in which.

DESCRIPTION OF THE PREFERRED EMBODIMENTS

Embodiment 1

Figure 1:
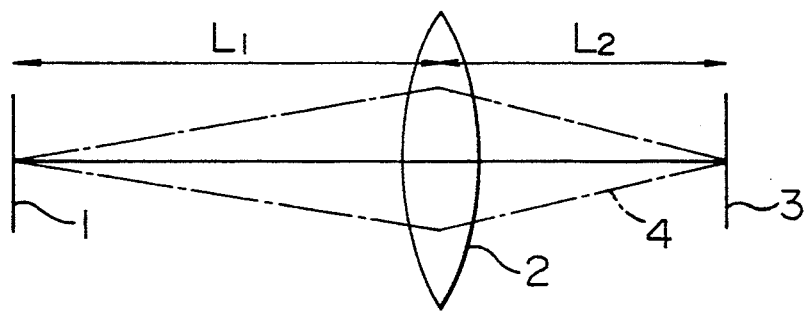
FIG. 1 is a view showing the trajectory of electron beams.
Figure 2:
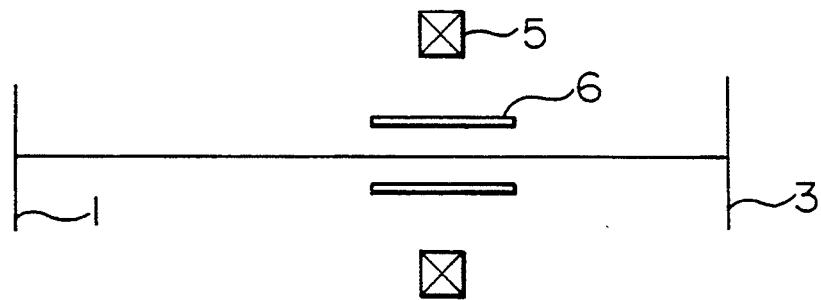
FIG. 2 is a schematic view showing the position of an electrostatic focus corrector and an objective lens.
Figure 3:
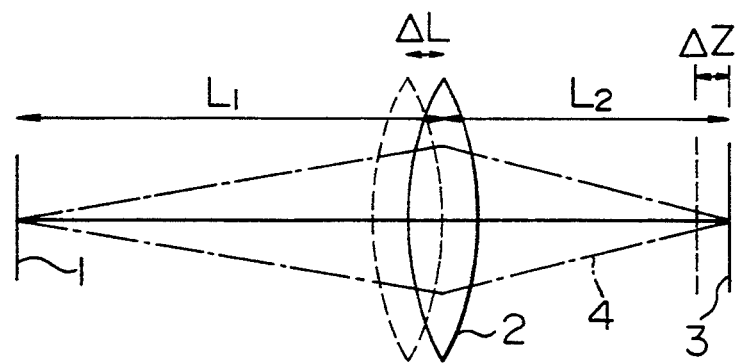
FIG. 3 is a schematic view showing the relationship between a lens center and an image plane in their movement.
Figure 4:
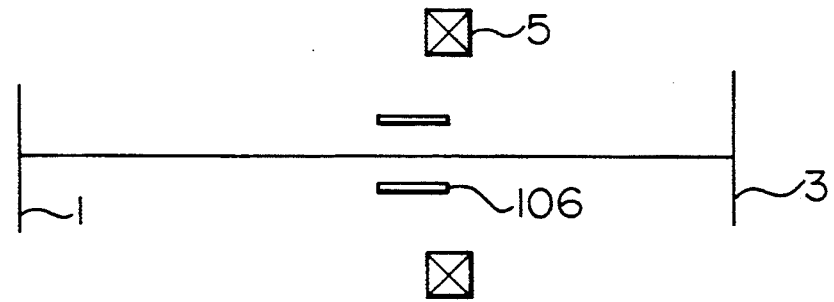
FIG. 4 is a view showing the arrangement for changing a lens center.
Figure 5:
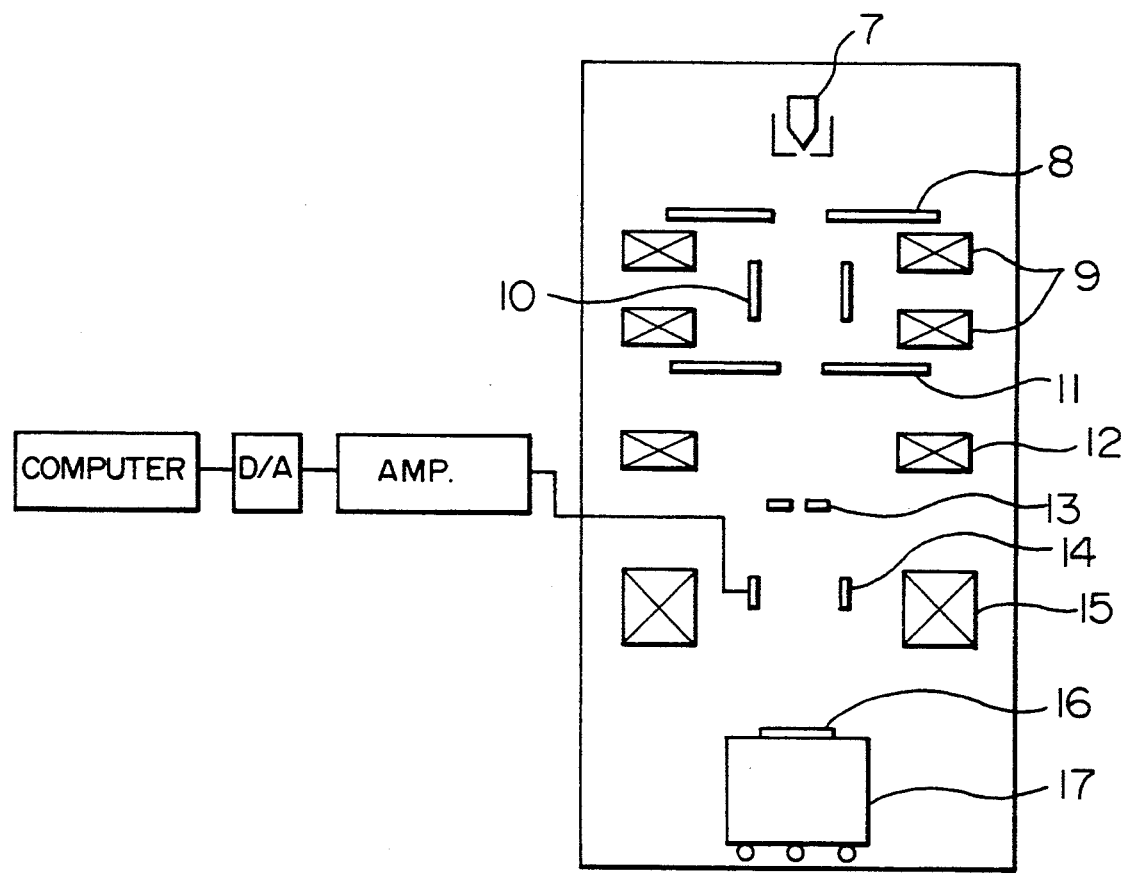
FIG. 5 is a view showing the arrangement of an electron beam writing system according to one embodiment of the present invention.

In an electron beam writing system shown in FIG. 5, an electron beam figure resulting from a first aperture 8 and a second aperture 11 is projected on a wafer (writing object) 16 through a demagnification lens 12 and an objective lens 15, the distance between an object plane and an image plane being 200 mm. This embodiment is applied to the electron beam writing system adopting a "cell projection method" in which the second aperture includes plural figure patterns. The aperture pattern is demagnified by the demagnification lens 12, and the demagnified pattern is projected on the wafer 12 through the objective lens 15. Thus, an electrostatic corrector 14 is arranged at the objective lens 15. The focus corrector, like other components of the writing system, is controlled by a computer. The arrangement of the components other than the objective lens and focus corrector may be substantially the same as the electron bean writing system (product name: HL-700) which is commercially available from HITACHI, LTD.

Figure 6:
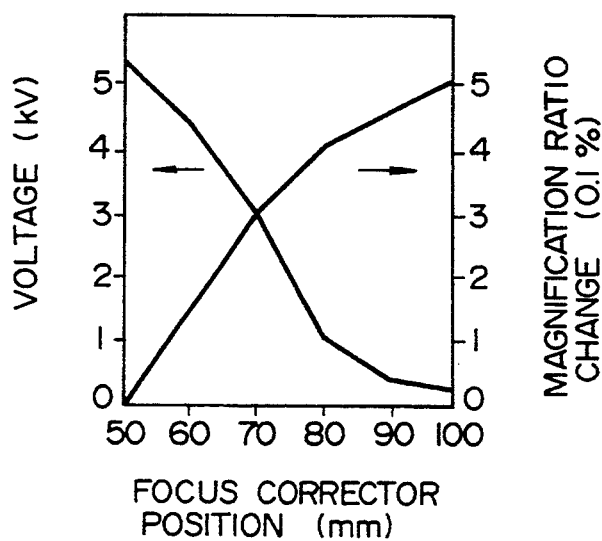
FIG. 6 is a graph showing dependency of changes in a magnification ratio on a focus corrector's position.

FIG. 6 illustrates a relationship between the center position of the electrostatic corrector 14 and the voltage necessary to correct the image plane position by 0.5 mm, as well as the changing rate of the magnification ratio attendant on the, correction. The correction sensitivity at the lens center where a magnetic field is strong is so high that the changing rate in the magnification ratio is as small as 0.5%. However, taking no further measure will change a rectangle 5 μm long by 0.025 μm. In this embodiment, in order to reduce such a change further, as described above, the position of the electrostatic focus corrector 14 is brought close to the object plane. When the corrector is brought close to the object plane by about 20 mm, the change can be reduced to 0.02 μm or less. However, oppositely, it should be noted that the voltage required for correction is increased by four times. The shot stitching accuracy in the writing performed with the corrector set for the position brought close to the object plane by 20 mm was 0.05 μm. Embodiment 2

Figure 7:
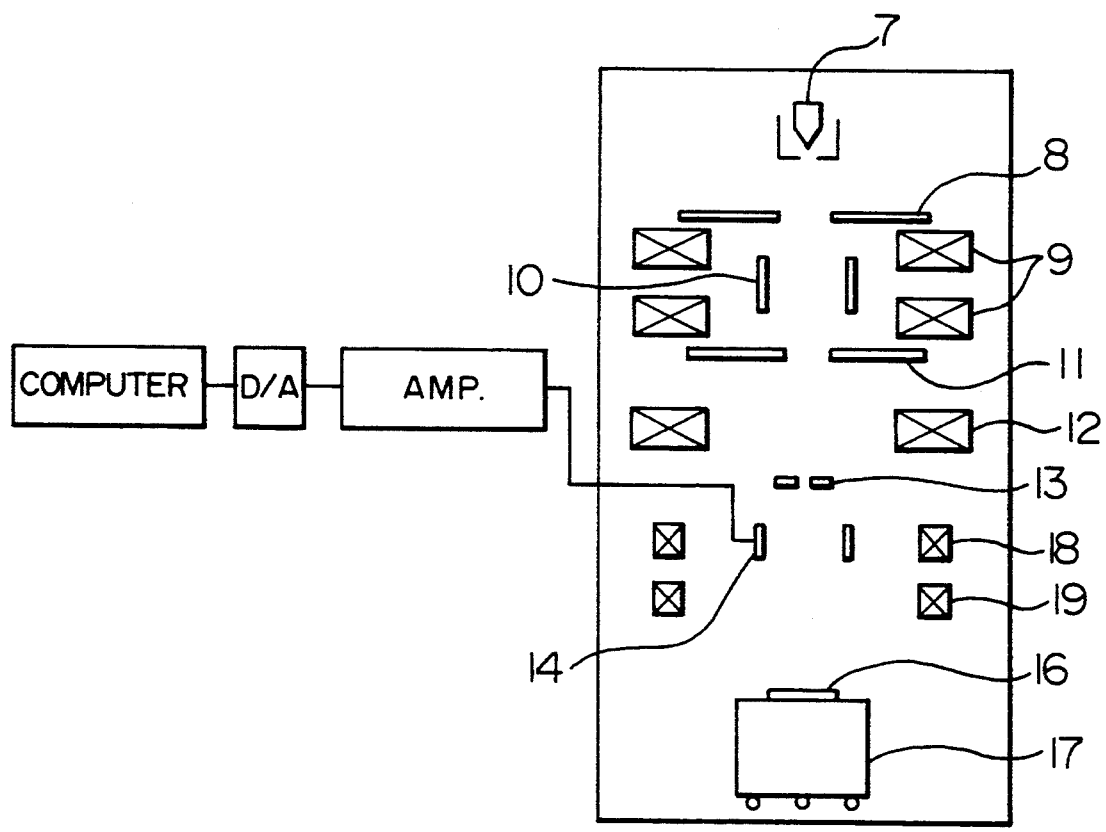
FIG. 7 is a view showing another arrangement of the electron beam writing system according to the present invention.

The same electrostatic focus correction as described above was performed in the electron beam writing system as shown in FIG. 7. In this embodiment, focus correction is made in the neighborhood of the magnetic field strength peak at the upper stage of two objective lenses 18 and 19 which provide the corresponding peaks of their magnetic field. This method, which permits focus correction in a strong magnetic field, can do the correction with a relative low voltage. In addition, a electrostatic focus corrector 14 can be arranged at a position nearer to the object plane with respect to the center between the object lenses 18 and 19. As a result, the correction of 0.5 mm can be attained with a voltage of 700 V and a changing rate of 0.2% in the magnification factor. Further, if both the upper stage objective lens 18 and the electrostatic focus corrector 14 are brought close to the object plane, focus correction with low voltage can be achieved with no change in the magnification ratio.

The above two embodiments can be theoretically implemented by focus correction using an electromagnetic coil. However, an arrangement of the magnetic coil near the object lens produces an eddy current; this requires time to make the correction. Therefore, the electrostatic focus correction described in connection with the above embodiments improves upon the electromagnetic method.

Figure 8:
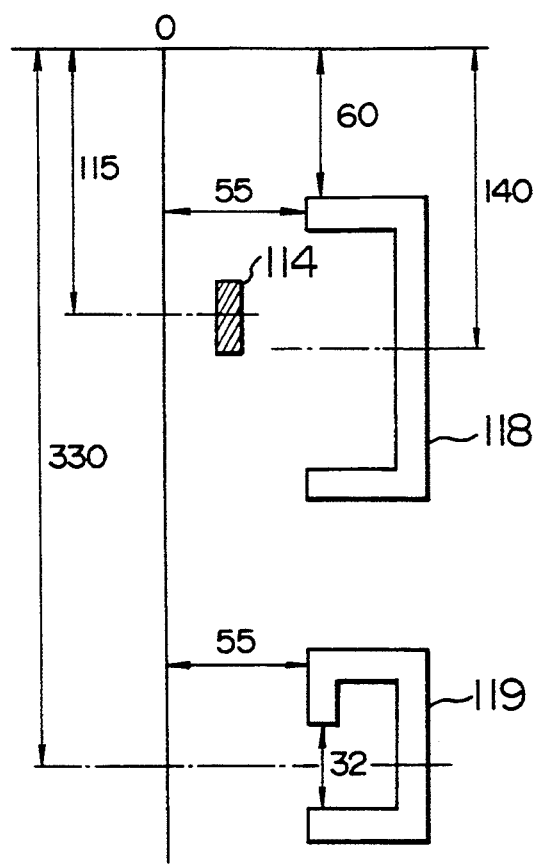
FIG. 8 is a view showing an another location of an objective lens and a focus corrector in the embodiment of FIG. 7.
Figure 9:
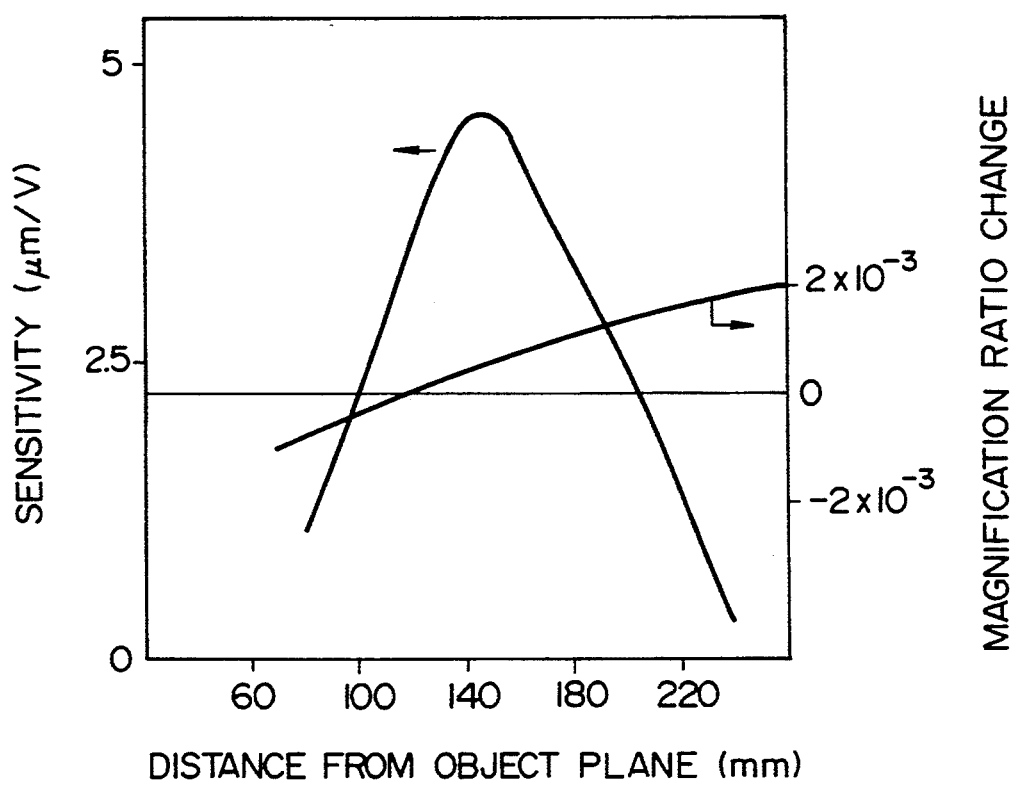
FIG. 9 is a graph showing dependency of changes for the magnification ratio in the optical system of FIG. 8.
Figure 10:
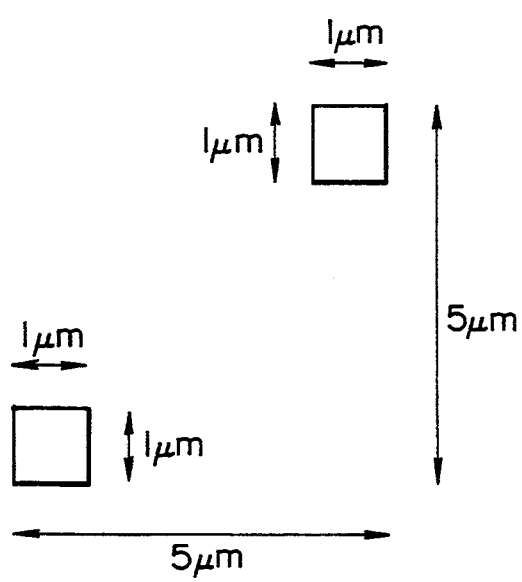
FIG. 10 is a view showing an aperture pattern for the embodiments of the present invention.

FIG. 8 shows another arrangement of objective lenses 118, 119 and a focus corrector 114. FIG. 9 shows the relationship between the center position of the electrostatic focus corrector 114, and the sensitivity required to correct the object plane position and the changing rate of the magnification ratio attendant on the correction. In the arrangement of FIG. 8, the area with the highest sensitivity and the area with substantially zero change in the magnification ratio are approximately equal distances from the object plane. As seen from FIG. 8, the focus corrector 114 is further shifted toward the object plane from the center of the objective lens 118 on the side of the object plane. The distance from the object plane to the center of the focus corrector is 115 mm as shown in FIG. 8. The dimension of the focus corrector is 18 mm in diameter and 40 mm in length. One objective lens 118 has windings about twice as many winding as the other objective lens 119.

The change in the magnification factor influences the size of a figure in a variable shaping writing system, and it also influences a position deviation in a cell projection writing system. For example, assuming that an aperture having a figure composed of two squares A and B each having an area of 1 $\mu m \times 1 \mu m$ is used, a change of 0.5% in the magnification ratio gives rise to a shift of 0.03 $\mu m$ in the center of the square B. In this way, in the cell projection writing system, a change in the magnification ratio influences the position of a figure as well as the size thereof.

As described above, in the electron beam writing system for making fine patterns on a wafer or mask according to the present invention, an electrostatic focus corrector for correcting field corrector due to electron deflection and the height of a sample is arranged in a lens providing the largest product of the magnification factors of the lens and all succeeding lenses and the optical path length of the lens at issue. For this reason, the electron beam according to the present invention provides high shot stitching accuracy and can write a variable shaped beam and a cell figure beam at a predetermined position so as to have a predetermined size. This improves the productivity of fabricating fine patterns for a semiconductor device or photomask.

The disclosures of U.S. patent application Ser. No. 07/770,527 (assigned to the same assignee as is the present invention), filed on Oct. 3, 1991 and of J. Vac. Sci. Technol. B9 (6), November/December 1991 pp.2940–2943 are hereby incorporated herein by reference.

Although the present invention has been described in detail. It should be understood that various changes, substitutions and alterations can be made hereto without departing from the spirit and scope of the present invention as defined by the appended claims.

We claim:

1. An electron beam writing system comprising:
   means for emitting electrons;
   an optical system for causing an electron beam to be emitted from said emitted electrons, and for projecting said electron beam on a writing object, wherein said optical system has a plurality of lenses including an objective lens for focusing said electron beam on said object wherein said objective lens has two lenses; and
   an electrostatic focus corrector for correcting the focus of said electron beam, wherein said focus corrector is arranged at a position in said two-lens objective lens that is closer to an object plane of the optical system than to an image plane of the optical system with respect to the objective lens.

2. An electron beam writing system according to claim 1, wherein the two lenses of said objective lens are electromagnetic lenses.

3. An electron beam writing system according to claim 2, wherein said focus corrector is arranged at one of said electromagnetic lenses which is nearer to said object plane than is the other of said electromagnetic lenses.

4. An optical system for an electron beam in an electron beam writing system having a plurality of lenses including an objective lens opposite to a writing object, comprising:
   an electrostatic focus corrector for correcting the focus of said electron beam, said focus corrector being arranged inside said objective lens;
   wherein said focus corrector is arranged at a position in said objective lens that is closer to an object plane of the optical system than to an image plane of the optical system with respect to said objective lens; and
   wherein said objective lens is composed of e pair of electromagnetic lenses.

5. An optical system according to claim 4, wherein said focus corrector is arranged at one of said pair of electromagnetic lenses which is nearer to said object plane and farther from the sample, as compared with the other of said pair of electromagnetic lenses.

6. A focus corrector used in an optical system for an electron beam in an electron beam writing system which has a plurality of lenses including an objective lens and serving to correct the focus of said electron beam, wherein said focus corrector is an electrostatic focus corrector, and arranged at a position in said objective lens that is closer to an object plane than to an image plane of said optical system with respect to said objective lens, and wherein said objective lens comprises a pair of electromagnetic lenses.

7. A focus corrector according to claim 6, wherein said focus corrector is arranged at one of said pair of electromagnetic lenses which is nearer to said object plane than is the other of said pair of electromagnetic lenses.

* * * * *